US009620600B2

(12) United States Patent
Ohara et al.

(10) Patent No.: US 9,620,600 B2
(45) Date of Patent: Apr. 11, 2017

(54) SEMICONDUCTOR DEVICE HAVING TERMINATION REGION WITH LATERALLY HETEROGENEOUS INSULATING FILMS

(71) Applicant: Kabushiki Kaisha Toshiba, Minato-ku, Tokyo (JP)

(72) Inventors: Ryoichi Ohara, Himeji Hyogo (JP); Takao Noda, Himeji Hyogo (JP)

(73) Assignee: Kabushiki kaisha Toshiba, Tokyo (JP)

( * ) Notice: Subject to any disclaimer, the term of this patent is extended or adjusted under 35 U.S.C. 154(b) by 0 days.

(21) Appl. No.: 14/854,516

(22) Filed: Sep. 15, 2015

(65) Prior Publication Data

US 2016/0276448 A1    Sep. 22, 2016

(30) Foreign Application Priority Data

Mar. 16, 2015   (JP) ................................. 2015-051679

(51) Int. Cl.
| | |
|---|---|
| H01L 29/06 | (2006.01) |
| H01L 29/417 | (2006.01) |
| H01L 29/78 | (2006.01) |
| H01L 29/16 | (2006.01) |

(52) U.S. Cl.
CPC ...... H01L 29/41725 (2013.01); H01L 29/063 (2013.01); H01L 29/7811 (2013.01); *H01L 29/1608* (2013.01)

(58) Field of Classification Search
CPC .................................................. H01L 29/0619
See application file for complete search history.

(56) References Cited

U.S. PATENT DOCUMENTS

| | | | |
|---|---|---|---|
| 6,940,110 B2 | 9/2005 | Takahashi et al. | |
| 8,592,298 B2* | 11/2013 | Romano | ............. H01L 29/0619 257/458 |
| 2011/0220913 A1 | 9/2011 | Hatakeyama | |
| 2012/0228636 A1* | 9/2012 | Maeyama | ........... H01L 29/0619 257/77 |
| 2013/0126885 A1* | 5/2013 | Disney | ................ H01L 21/2654 257/76 |

FOREIGN PATENT DOCUMENTS

| | | |
|---|---|---|
| JP | 09-069580 | 3/1997 |
| JP | 2008-034646 A | 2/2008 |
| JP | 2009-004452 A | 1/2009 |

* cited by examiner

*Primary Examiner* — Daniel Whalen
(74) *Attorney, Agent, or Firm* — White & Case LLP

(57) ABSTRACT

A semiconductor device according to an embodiment includes a semiconductor substrate having a first surface and a second surface. The semiconductor substrate includes an element region and a termination region provided around the element region. The termination region has a first semiconductor region of a first conductivity type provided at the first surface of the semiconductor substrate and a second semiconductor region of a second conductivity type provided between the first semiconductor region and the second surface. The semiconductor device further includes a first insulating film provided on the first semiconductor region, a second insulating film provided on the first semiconductor region and having a portion interposed between the first insulating films, a first electrode provided on the first surface of the element region and electrically connected to the first semiconductor region, and a second electrode provided at the second surface of the semiconductor substrate.

10 Claims, 10 Drawing Sheets

SEMICONDUCTOR DEVICE HAVING TERMINATION REGION WITH LATERALLY HETEROGENEOUS INSULATING FILMS

CROSS-REFERENCE TO RELATED APPLICATION

This application is based upon and claims the benefit of priority from Japanese Patent Application No. 2015-051679, filed on Mar. 16, 2015, the entire contents of which are incorporated herein by reference.

FIELD

Embodiments described herein relate generally to semiconductor devices.

BACKGROUND

It has been known that the reliability of a semiconductor device is degraded due to a variation in characteristics caused by charge included in an insulating film. When the semiconductor device is operating or is in a standby state, charge included in the insulating film moves in the semiconductor device and causes a variation in the breakdown voltage of the semiconductor device or a variation in leakage current.

DETAILED DESCRIPTION

Figure 1:
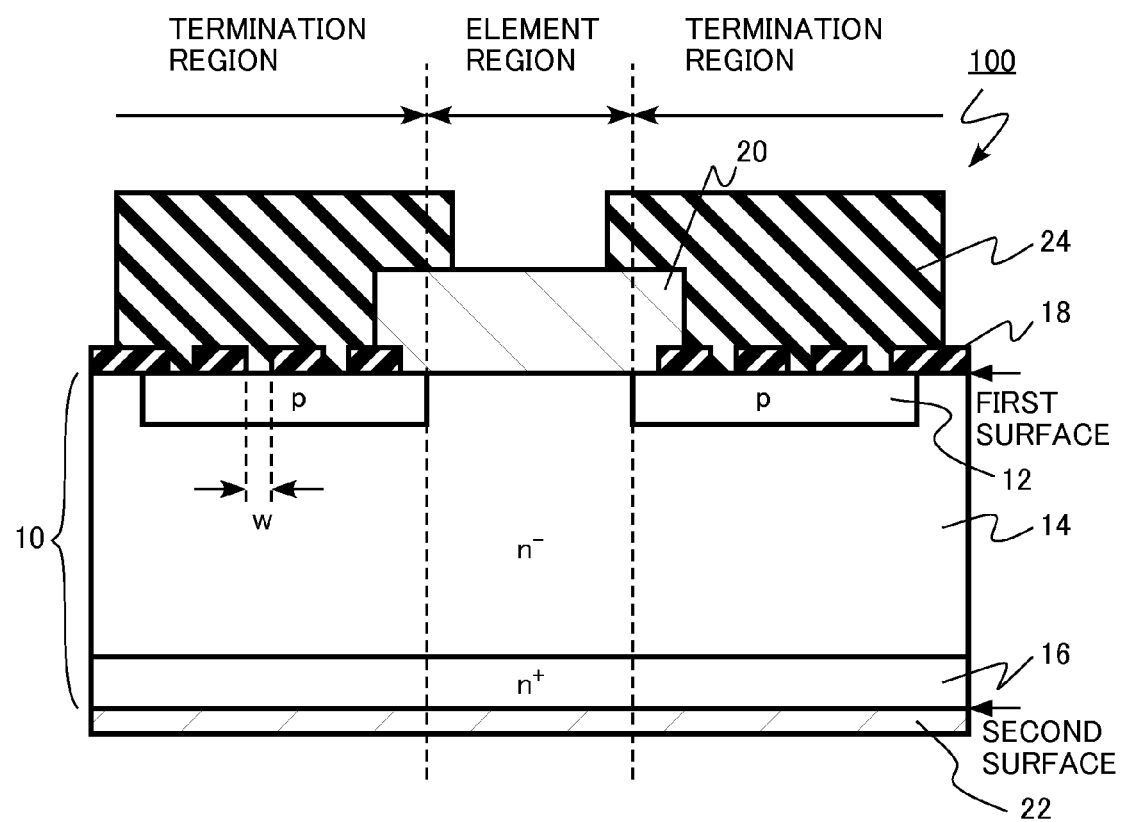
FIG. 1 is a cross-sectional view schematically illustrating a semiconductor device according to a first embodiment.

A semiconductor device according to an embodiment includes: a semiconductor substrate having a first surface and a second surface, the semiconductor substrate including an element region and a termination region provided around the element region, the termination region having a first semiconductor region of a first conductivity type provided at the first surface and a second semiconductor region of a second conductivity type provided between the first semiconductor region and the second surface; a first insulating film provided on the first semiconductor region; a second insulating film provided on the first semiconductor region, the second insulating film having a portion interposed between a first part of the first insulating film and a second part of the first insulating film; a first electrode provided on the first surface of the element region, the first electrode electrically connected to the first semiconductor region; and a second electrode provided at the second surface of the element region and the termination region.

Hereinafter, embodiments of the invention will be described with reference to the drawings. In the following description, for example, the same or similar members are denoted by the same reference numerals and the description thereof will not be repeated.

In the following description, $n^+$, $n$, $n^-$, $p^+$, $p$, and $p^-$ indicate the relative impurity concentration levels of each conductivity type. That is, $n^+$ indicates that an n-type impurity concentration is high, as compared to n, and $n^-$ indicates that an n-type impurity concentration is low, as compared to n. In addition, $p^+$ indicates that a p-type impurity concentration is high, as compared to p, and $p^-$ indicates that a p-type impurity concentration is low, as compared to p. In addition, in some cases, an $n^+$ type and an $n^-$ type are simply referred to as an n type and a $p^+$ type and a $p^-$ type are simply referred to as a p type.

First Embodiment

A semiconductor device according to this embodiment includes a semiconductor substrate having a first surface and a second surface. The semiconductor substrate includes an element region and a termination region provided around the element region. The termination region includes a first semiconductor region of a first conductivity type which is provided at the first surface of the semiconductor substrate and a second semiconductor region of a second conductivity type which is provided between the first semiconductor region and the second surface. The semiconductor device further includes a first insulating film provided on the first semiconductor region, a second insulating film which is provided on the first semiconductor region and has a portion interposed between the first insulating films, a first electrode which is provided on the first surface in the element region and is electrically connected to the first semiconductor region, and a second electrode provided at the second surface of the semiconductor substrate.

Figure 2:
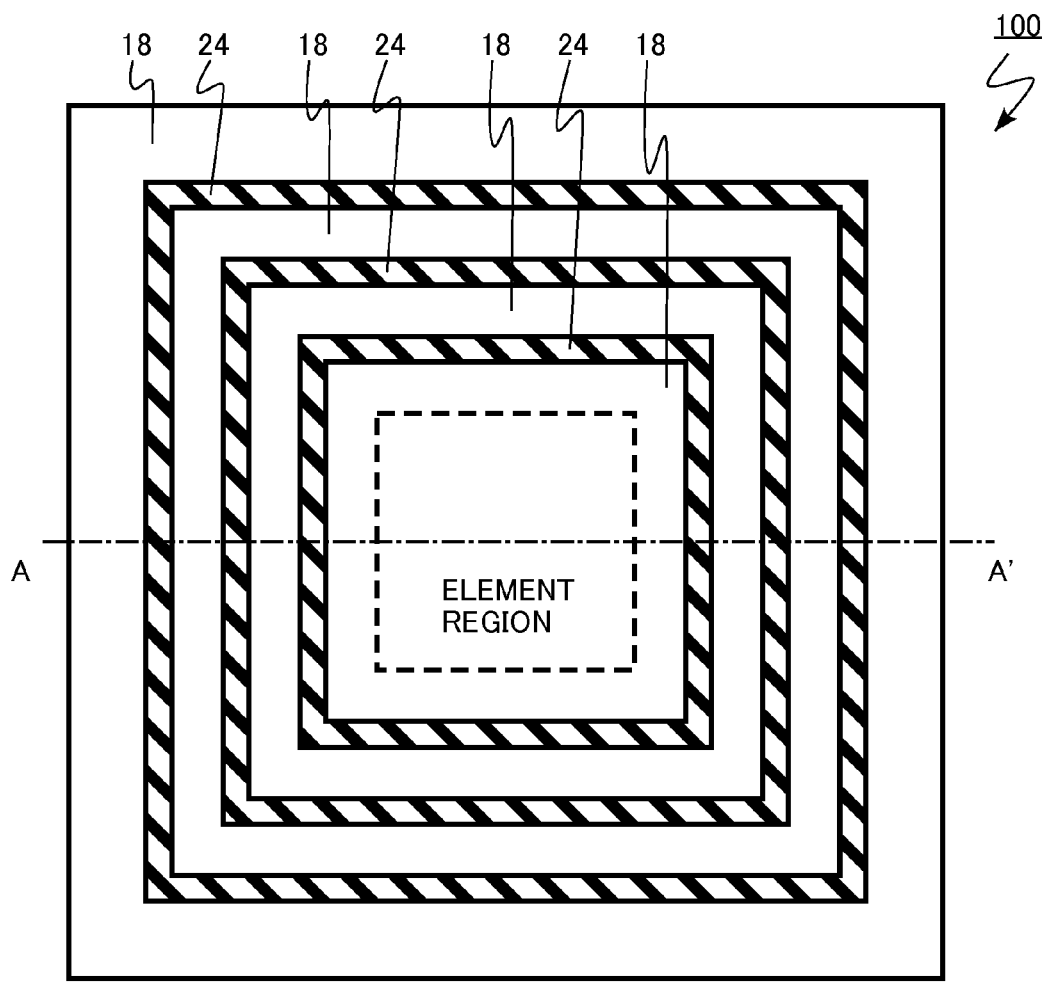
FIG. 2 is a plan view schematically illustrating the semiconductor device according to the first embodiment.

FIG. 1 is a cross-sectional view schematically illustrating a semiconductor device according to this embodiment. FIG. 2 is a plan view schematically illustrating the semiconductor device according to this embodiment. FIG. 2 illustrates the pattern of an insulating film provided immediately above a semiconductor substrate. FIG. 1 illustrates a cross section taken along the line A-A' of FIG. 2. The semiconductor device according to this embodiment is a Schottky barrier diode (SBD).

An SBD 100 includes the semiconductor substrate. The semiconductor substrate includes an element region and a termination region which surrounds the element region. The element region functions as a region in which a current mainly flows when the SBD 100 is forward-biased. The termination region functions as a region which reduces the intensity of the electric field applied to the end of the element region when the SBD 100 is reverse-biased and improves the element breakdown voltage of the SBD 100.

The SBD 100 includes a semiconductor substrate 10, a p-type RESURF region (first semiconductor region) 12, an $n^-$ drift region (second semiconductor region) 14, an $n^+$ cathode region 16, a field oxide film (first insulating film) 18, an anode electrode (first electrode) 20, a cathode electrode (second electrode) 22, and a passivation film (second insulating film) 24.

The semiconductor substrate 10 has a first surface and a second surface opposite to the first surface. In FIG. 1, the first surface is an upper surface and the second surface is a lower surface.

The semiconductor substrate 10 is, for example, a SiC substrate with a 4H-SiC structure. The thickness of the semiconductor substrate 10 is, for example, equal to or greater than 5 μm and equal to or less than 600 μm.

The p-type RESURF region (first semiconductor region) 12 is provided at the first surface of the semiconductor substrate 10 so as to surround the element region. The p-type RESURF region 12 includes p-type impurities. The p-type impurity is, for example, aluminum (Al). The impurity concentration of the p-type impurities is, for example, equal to or greater than $1 \times 10^{16}$ cm$^{-3}$ and equal to or less than $1 \times 10^{19}$ cm$^{-3}$.

The n$^-$ drift region (second semiconductor region) 14 is provided between the p-type RESURF region 12 and the second surface. The n$^-$ drift region 14 is also provided at the first surface of the element region. The n$^-$ drift region 14 includes n-type impurities. The n-type impurity is, for example, nitrogen (N). The impurity concentration of the n-type impurities is, for example, equal to or greater than $5 \times 10^{14}$ cm$^{-3}$ and equal to or less than $5 \times 10^{16}$ cm$^{-3}$.

The cathode region 16 is provided at the second surface of the semiconductor substrate 10. The n$^+$ cathode region 16 includes n-type impurities. The n-type impurity is, for example, nitrogen (N). The impurity concentration of the n-type impurities is, for example, equal to or greater than $1 \times 10^{18}$ cm$^{-3}$ and equal to or less than $1 \times 10^{20}$ cm$^{-3}$.

The field oxide film (first insulating film) 18 is provided on the p-type RESURF region 12. The field oxide film 18 has an opening (first opening) which is formed in the element region. In addition, the field oxide film 18 has an opening (second opening) which is formed in a portion on the p-type RESURF region 12. The field oxide film 18 is, for example, a silicon oxide film. The thickness of the field oxide film 18 is, for example, equal to or greater than 0.01 μm and equal to or less than 10 μm.

The anode electrode (first electrode) 20 contacts with the n$^-$ drift region 14 and the p-type RESURF region 12 in the opening (first opening) of the field oxide film 18. A contact between the anode electrode 20 and the n$^-$ drift region 14 is a Schottky contact. It is preferable that a contact between the anode electrode 20 and the p-type RESURF region 12 be an ohmic contact.

The anode electrode 20 is made of metal. The anode electrode 20 is, for example, a stacked film of titanium (Ti) and aluminum (Al).

The cathode electrode 22 is provided to contact with the second surface of the semiconductor substrate 10. The cathode electrode 22 is provided so as to contact with the n$^+$ cathode region 16. It is preferable that a contact between the cathode electrode 22 and the n$^+$ cathode region 16 be an ohmic contact.

The cathode electrode 22 is made of metal. The cathode electrode 22 is, for example, a stacked film including nickel silicide.

The passivation film (second insulating film) 24 is provided on the field oxide film 18 and the anode electrode 20. The opening (second opening) of the field oxide film 18 provided on the p-type RESURF region 12 is filled with the passivation film 24 and the passivation film 24 contacts with the p-type RESURF region 12. The passivation film 24 is interposed between the field oxide films 18 in the opening (second opening) of the field oxide film 18.

As illustrated in FIG. 2, portions of the passivation film 24 which contact with the p-type RESURF region 12 are arranged in an annular pattern which surrounds the element region.

The passivation film 24 is, for example, a resin film. The passivation film 24 is made of, for example, polyimide.

Next, the function and effect of the SBD 100 according to this embodiment will be described.

Figure 3:
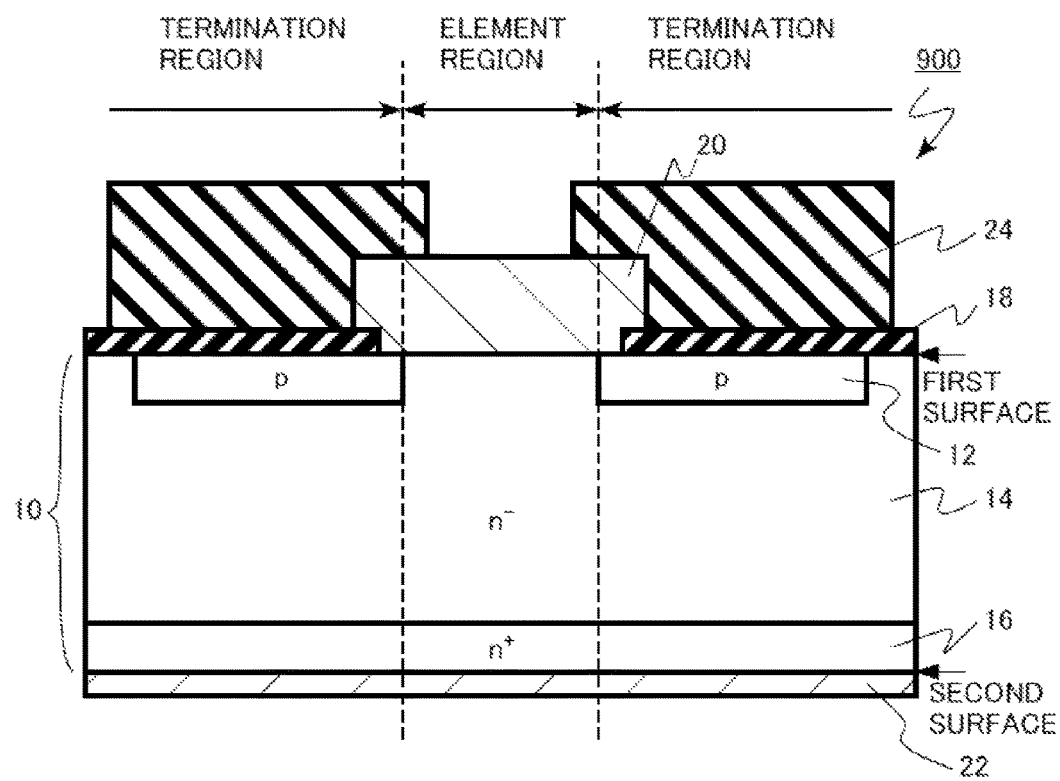
FIG. 3 is a cross-sectional view schematically illustrating a semiconductor device according to a comparative example.

FIG. 3 is a cross-sectional view schematically illustrating a semiconductor device according to a comparative example. A semiconductor device according to the comparative example is an SBD 900. The SBD 900 is similar to the semiconductor device according to the first embodiment except that it does not have the structure in which the passivation film 24 is interposed between the field oxide films 18.

The SBD 900 includes a p-type RESURF region 12 provided in a termination region. When the SBD 900 is reverse-biased, the reverse bias is applied to a pn junction between the p-type RESURF region 12 and an n$^-$ drift region 14. When the reverse bias is applied, the p-type RESURF region 12 is depleted to reduce the intensity of the electric field applied to the end of the element region. Therefore, the breakdown voltage of the SBD 100 is improved.

When the reverse bias is applied to the pn junction, the electric field is applied to the field oxide film 18 in the termination region in the horizontal direction. Charge in the field oxide film 18 is moved in the horizontal direction by the electric field applied in the horizontal direction. When the charge is moved in the field oxide film 18, the charge balance of the termination region is lost. Therefore, there is a concern that a reduction in reliability, such as a breakdown voltage variation or a leakage current variation, will occur.

The charge moved in the field oxide film 18 is, for example, a hydrogen ion, a fluorine ion, a chlorine ion, or a sodium ion.

In the SBD 100 according to this embodiment, the passivation film 24 which contacts with the p-type RESURF region 12 and is interposed between the field oxide films 18 is provided to divide the field oxide films 18 in the horizontal direction. Therefore, the movement of charge in the field oxide film 18 in the horizontal direction is suppressed. It is possible to prevent the charge balance of the termination region from being lost. As a result, a variation in the characteristics of the SBD 100 is prevented and reliability is improved.

An interface between the field oxide film 18 and the passivation film 24 functions as an energy barrier to prevent the movement of charge in the field oxide film 18 in the horizontal direction.

It is preferable that the width ("w" in FIG. 1) of a portion of the passivation film 24 which is interposed between the field oxide films 18 be equal to or greater than 1 μm in order to further prevent the movement of charge.

In the SBD 100, a portion of the passivation film 24 which contacts with the p-type RESURF region 12 is an annular pattern surrounding the element region. Therefore, the field oxide film 18 is completely divided in the horizontal direction on the p-type RESURF region 12. As a result, the movement of charge in the field oxide film 18 in the horizontal direction is effectively prevented.

In the SBD using a semiconductor material, such as SiC, having a wider bandgap than silicon (Si), since the breakdown voltage of the material is high, the electric field intensity of the substrate is designed so as to be high. Therefore, the electric field intensity of the field oxide film 18 is also high. In the SBD using a wide bandgap semiconductor, a reduction in reliability is more likely to occur due to the breaking of the charge balance of the termination region than that in the SBD using silicon. Therefore, this embodiment is particularly effective in the SBD using a wide bandgap semiconductor such as SiC.

In this embodiment, in the passivation film 24, three portions contact with the p-type RESURF region 12. However, the number of contact portions is not necessarily limited to three. The number of contact portions may be 1, 2, or 4 or more.

In this embodiment, a portion of the passivation film 24 which contact with the p-type RESURF region 12 has an annular shape. However, the portion of the passivation film 24 is not limited to the annular pattern. The portion of the passivation film 24 may be formed in any pattern as long as it can divide at least a portion of the field oxide film 18 in the horizontal direction.

In this embodiment, it is possible to achieve the SBD 100 which can prevent the movement of charge in the field oxide film 18 in the termination region and improve reliability.

Second Embodiment

A semiconductor device according to this embodiment is similar to the semiconductor device according to the first embodiment except that the first-conductivity-type impurity concentration of a first position in the first semiconductor region is higher than the first-conductivity-type impurity concentration of a second position which is further away from the element region than the first position in the first semiconductor region. Therefore, the description of the same content as that in the first embodiment will not be repeated.

Figure 4:
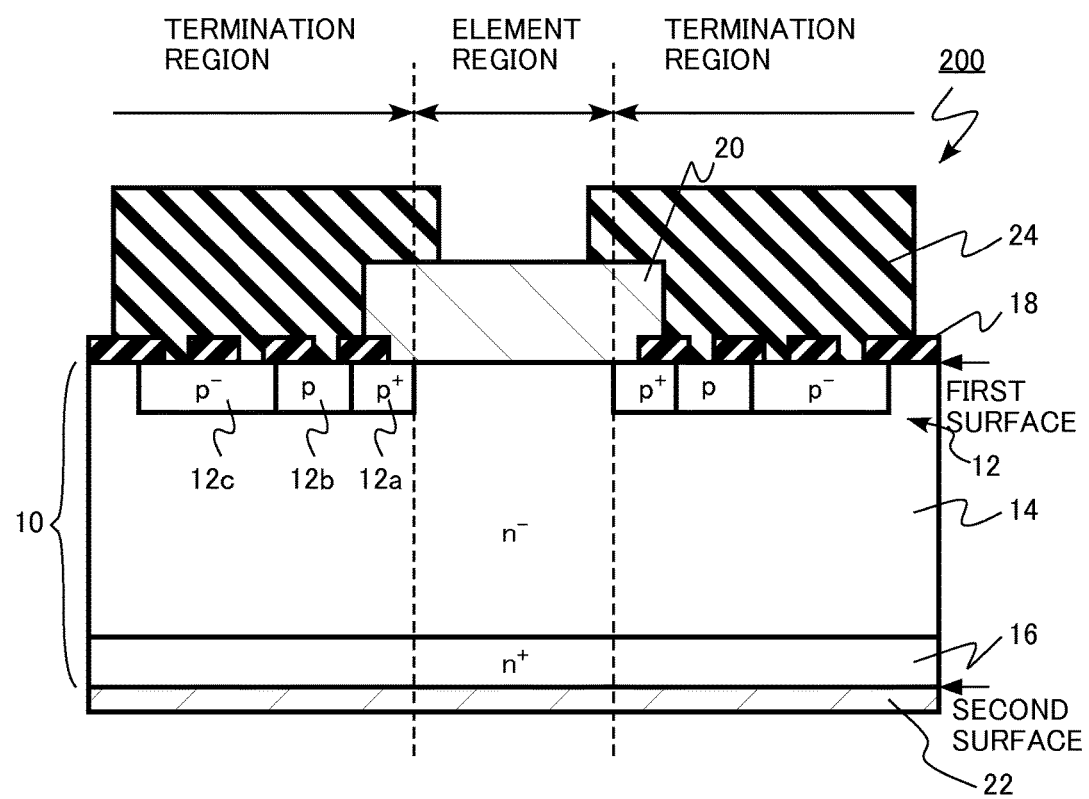
FIG. 4 is a cross-sectional view schematically illustrating a semiconductor device according to a second embodiment.

FIG. 4 is a cross-sectional view schematically illustrating the semiconductor device according to this embodiment. The semiconductor device according to this embodiment is an SBD 200.

In the SBD 200, a p-type RESURF region 12 includes a first p-type region 12a, a second p-type region 12b, and a third p-type region 12c. The impurity concentration of p-type impurities is reduced in the order of the first p-type region 12a, the second p-type region 12b, and the third p-type region 12c. In the p-type RESURF region 12, the impurity concentration of the p-type impurities at a position (first position) close to the element region is higher than the impurity concentration of the p-type impurities at a position (second position) away from the element region.

According to this embodiment, similarly to the first embodiment, it is possible to achieve the SBD 200 which can prevent the movement of charge in the field oxide film 18 in the termination region and improve reliability. In addition, since a concentration distribution is provided in the p-type RESURF region 12, the breakdown voltage of the SBD 200 is improved.

Third Embodiment

A semiconductor device according to this embodiment is similar to the semiconductor device according to the first embodiment except that the second insulating film is different from the passivation film. Therefore, the description of the same content as that in the first embodiment will not be repeated.

Figure 5:
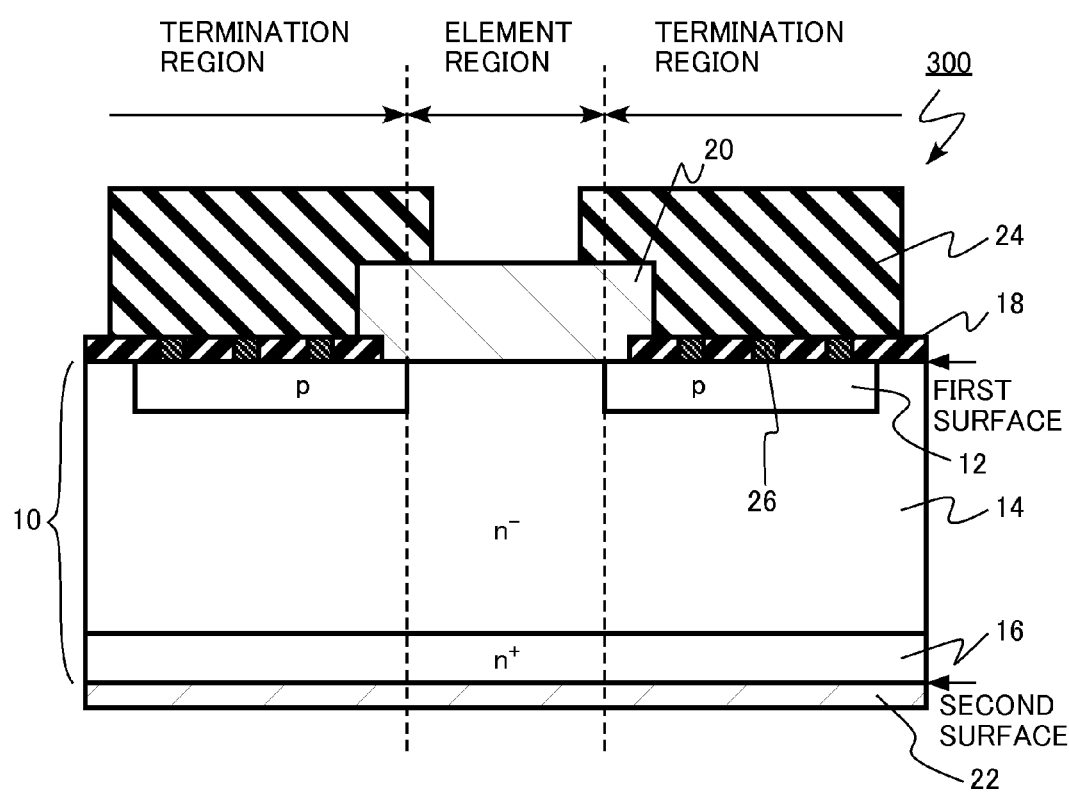
FIG. 5 is a cross-sectional view schematically illustrating a semiconductor device according to a third embodiment.

FIG. 5 is a cross-sectional view schematically illustrating the semiconductor device according to this embodiment. The semiconductor device according to this embodiment is an SBD 300.

The SBD 300 includes a separation insulating film (second insulating film) 26 which contact with a p-type RESURF region 12 and is interposed between field oxide films 18. A passivation film 24 is provided on the separation insulating film 26.

The separation insulating film 26 is, for example, a nitride film or an oxynitride film. The separation insulating film 26 is, for example, a silicon nitride film.

According to this embodiment, similarly to the first embodiment, it is possible to achieve the SBD 300 which can prevent the movement of charge in the field oxide film 18 in the termination region and improve reliability. In addition, since the second insulating film is different from the passivation film 24, it is possible to optimize a material forming the film which divides the field oxide film 18 in order to prevent the movement of charge.

Fourth Embodiment

A semiconductor device according to this embodiment is similar to the semiconductor device according to the first embodiment except that an element region includes a third semiconductor region of a first conductivity type which is provided at the first surface and a second semiconductor region provided between the third semiconductor region and the second surface and the first electrode is electrically connected to the third semiconductor region. Therefore, the description of the same content as that in the first embodiment will not be repeated.

Figure 6:
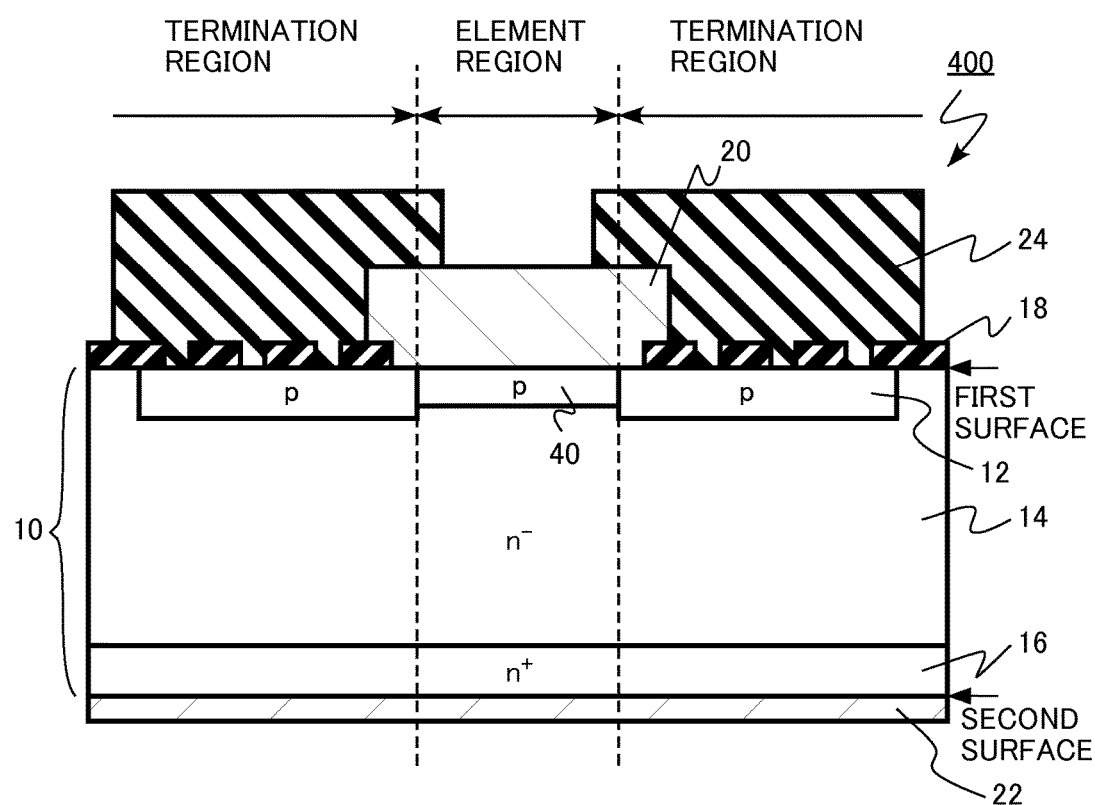
FIG. 6 is a cross-sectional view schematically illustrating a semiconductor device according to a fourth embodiment.

FIG. 6 is a cross-sectional view schematically illustrating the semiconductor device according to this embodiment. The semiconductor device according to this embodiment is a PIN diode 400.

In the PIN diode 400, the element region includes a p-type anode region (third semiconductor region) 40 which is provided at the first surface. An n⁻ drift region (second semiconductor region) 14 is provided between the p-type anode region (third semiconductor region) 40 and the second surface. A termination region has the same structure as that in the first embodiment.

An anode electrode (first electrode) 20 is electrically connected to the p-type anode region (third semiconductor region) 40. The anode electrode (first electrode) 20 contact with the p-type anode region (third semiconductor region) 40.

According to this embodiment, similarly to the first embodiment, it is possible to achieve the PIN diode 400 which can prevent the movement of charge in the field oxide film 18 in the termination region and improve reliability.

Fifth Embodiment

A semiconductor device according to this embodiment is similar to the semiconductor device according to the first embodiment except that an element region includes a third semiconductor region of a first conductivity type which is provided at the first surface, a second semiconductor region provided between the third semiconductor region and the second surface, a fourth semiconductor region of a second conductivity type which is provided in the third semiconductor region, agate insulating film provided on the third semiconductor region, and a gate electrode provided on the gate insulating film and the first electrode is electrically connected to the third semiconductor region and the fourth semiconductor region. Therefore, the description of the same content as that in the first embodiment will not be repeated.

Figure 7:
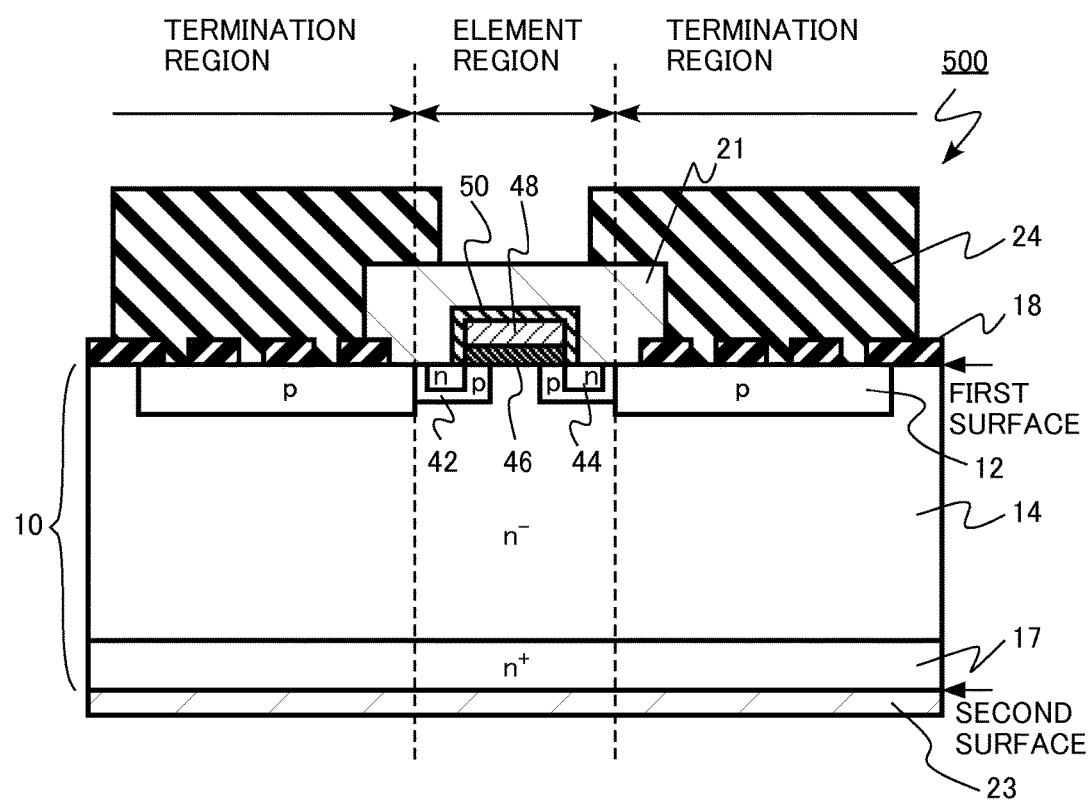
FIG. 7 is a cross-sectional view schematically illustrating a semiconductor device according to a fifth embodiment.

FIG. 7 is a cross-sectional view schematically illustrating the semiconductor device according to this embodiment. The semiconductor device according to this embodiment is a MOSFET 500.

In the MOSFET 500, the element region includes a p-type base region (third semiconductor region) 42 provided at the first surface, an n$^+$ source region (fourth semiconductor region) 44, a gate insulating film 46, a gate electrode 48, an interlayer film 50, an n$^+$ drain region 17, a source electrode (first electrode) 21, and a drain electrode (second electrode) 23.

The source electrode (first electrode) 21 is electrically connected to the p-type base region (third semiconductor region) 42 and the n$^+$ source region (fourth semiconductor region) 44. The gate electrode 48 and the source electrode 21 are insulated from each other by the interlayer film 50.

A termination region has the same structure as that in the first embodiment.

According to this embodiment, similarly to the first embodiment, it is possible to achieve the MOSFET 500 which can prevent the movement of charge in the field oxide film 18 in the termination region and improve reliability.

Sixth Embodiment

A semiconductor device according to this embodiment is similar to the semiconductor device according to the first embodiment except that the passivation film surrounding the element region has gaps. Therefore, the description of the same content as that in the first embodiment will not be repeated.

Figure 8:
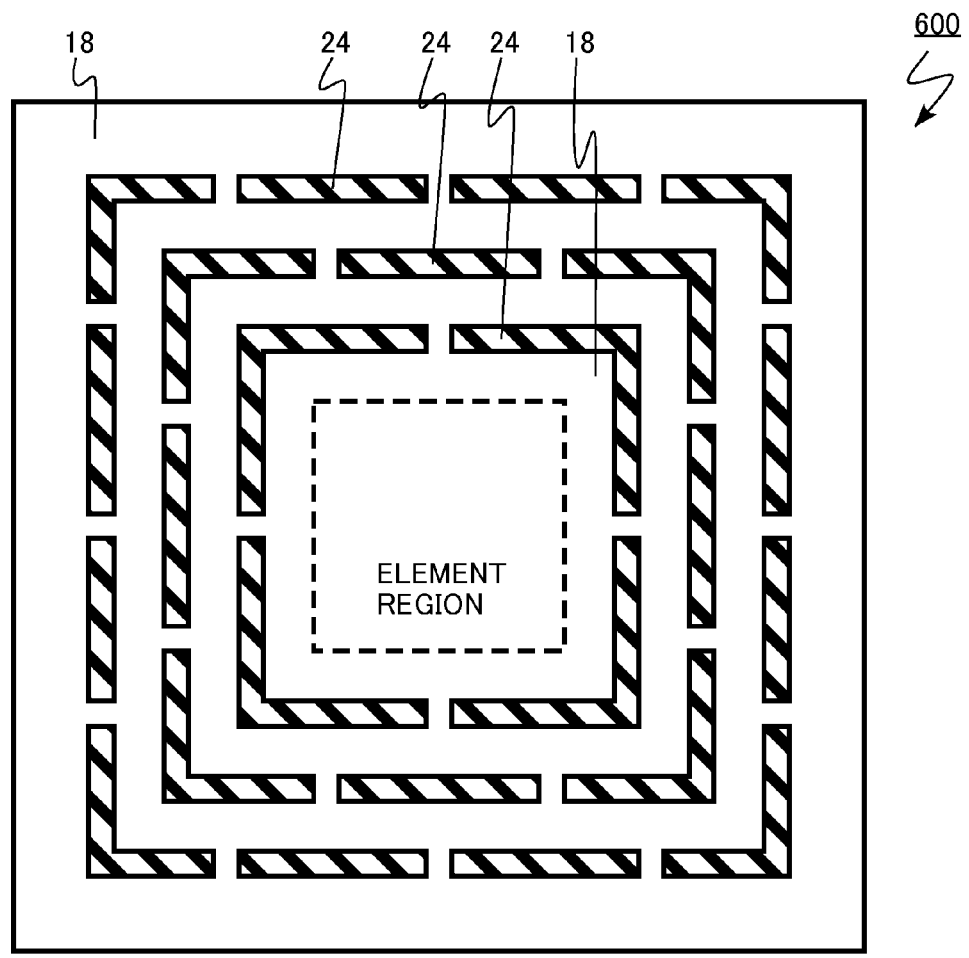
FIG. 8 is a plan view schematically illustrating the semiconductor device according to the sixth embodiment.

FIG. 8 is a plan view schematically illustrating the semiconductor device according to this embodiment. FIG. 8 illustrates the pattern of an insulating film provided immediately above a semiconductor substrate. The semiconductor device according to this embodiment is a Schottky barrier diode (SBD).

As illustrated in FIG. 8, portions of the passivation film 24 which contact with the p-type RESURF region 12 are arranged in an annular pattern which surrounds the element region of SBD 600. In addition, the annular pattern has gaps. The gaps are provided so as not to align in same line extending from the element region to chip edge.

According to this embodiment, similarly to the first embodiment, it is possible to achieve the SBD 600 which can prevent the movement of charge in the field oxide film 18 in the termination region and improve reliability.

In addition, because the annular pattern of passivation film 24 has gaps, contamination from the passivation film 24 can be suppressed. And, because the annular pattern of passivation film 24 has gaps, process damage caused in formation of opening of the field oxide films 18 can be suppressed.

Seventh Embodiment

A semiconductor device according to this embodiment includes a semiconductor substrate having a first surface and a second surface. The semiconductor substrate includes an element region and a termination region provided around the element region. The termination region includes a first semiconductor region of a first conductivity type which is provided at the first surface of the semiconductor substrate, a second semiconductor region of a second conductivity type which is provided between the first semiconductor region and the second surface, and a third semiconductor region of the first conductivity type which is provided in the first semiconductor region, is shallower than the first semiconductor region, and has a higher impurity concentration than the first semiconductor region. The semiconductor device further includes a first electrode which is provided on the first surface in the element region and is electrically connected to the first semiconductor region and a second electrode provided on the second surface of the semiconductor substrate.

Figure 9:
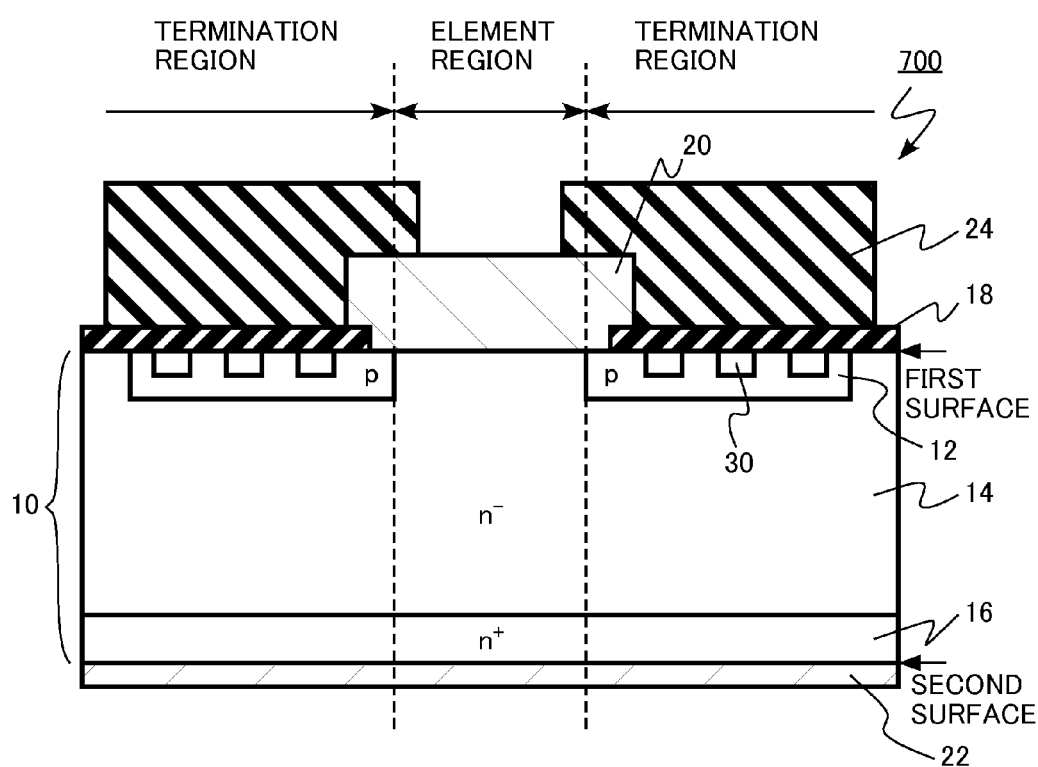
FIG. 9 is a cross-sectional view schematically illustrating a semiconductor device according to a seventh embodiment.
Figure 10:
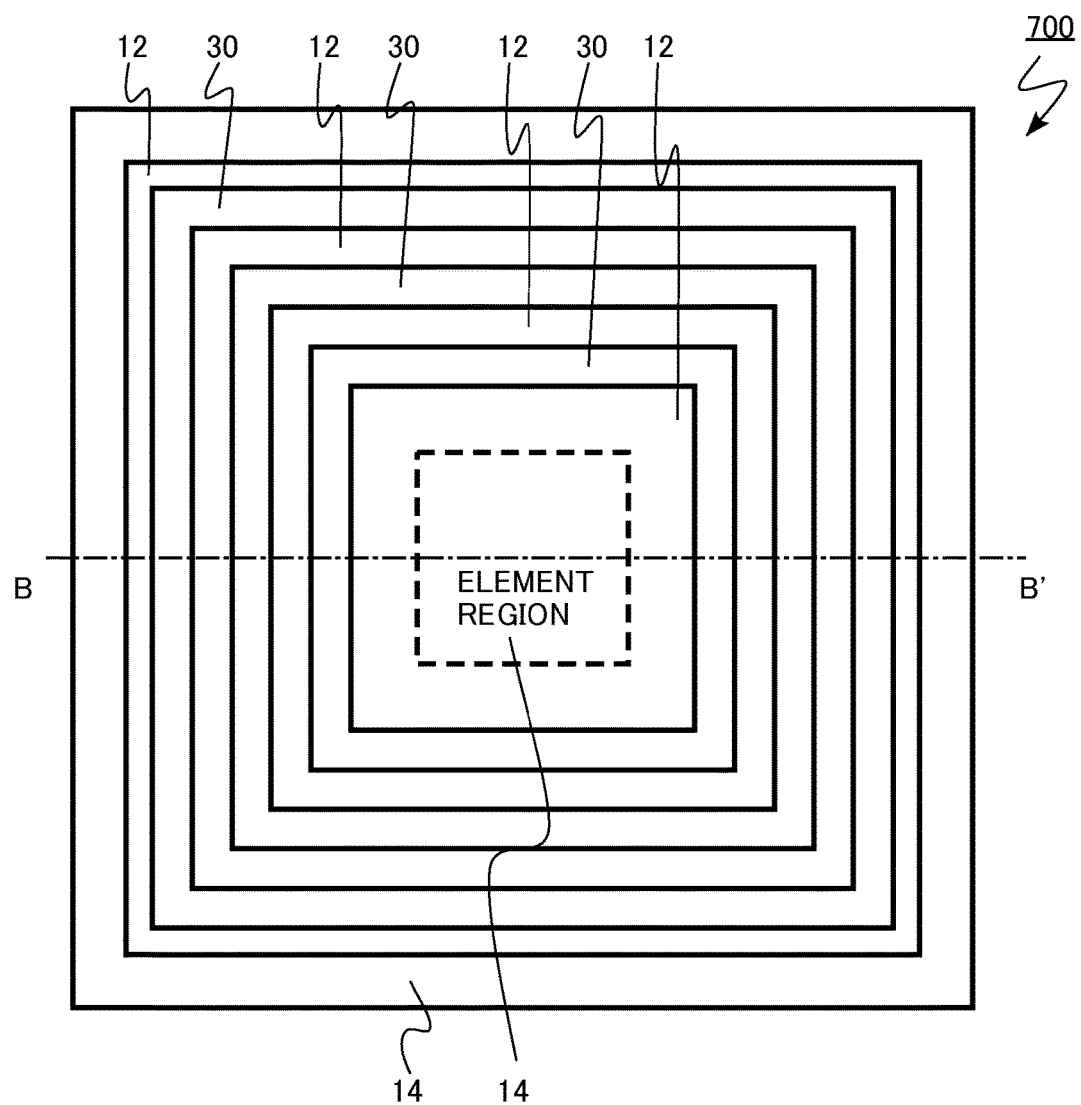
FIG. 10 is a plan view schematically illustrating the semiconductor device according to the seventh embodiment.

FIG. 9 is a cross-sectional view schematically illustrating the semiconductor device according to this embodiment. FIG. 10 is a plan view schematically illustrating the semiconductor device according to this embodiment. FIG. 10 illustrates the pattern of semiconductor regions at the surface of a semiconductor substrate. FIG. 9 illustrates a cross section taken along the line B-B' of FIG. 10. The semiconductor device according to this embodiment is an SBD 700.

The SBD 700 includes a semiconductor substrate. The semiconductor substrate has an element region and a termination region which surrounds the element region. The element region functions as a region in which a current mainly flows when the SBD 700 is forward-biased. The termination region functions as a region which reduces the intensity of the electric field applied to the end of the element region when the SBD 700 is reversed-biased and improves the element breakdown voltage of the SBD 700.

The SBD 700 includes a semiconductor substrate 10, a p-type RESURF region (first semiconductor region) 12, an n$^-$ drift region (second semiconductor region) 14, a n$^+$ cathode region 16, a field oxide film 18, an anode electrode (first electrode) 20, a cathode electrode (second electrode) 22, a passivation film 24, and a p$^+$ separation region (third semiconductor region) 30.

The semiconductor substrate 10 has a first surface and a second surface opposite to the first surface. In FIG. 8, the first surface is an upper surface and the second surface is a lower surface.

The semiconductor substrate 10 is, for example, a SiC substrate with a 4H-SiC structure. The thickness of the semiconductor substrate 10 is, for example, equal to or greater than 5 μm and equal to or less than 600 μm.

The p-type RESURF region (first semiconductor region) 12 is provided at the first surface of the semiconductor substrate 10 so as to surround the element region. The p-type RESURF region 12 includes p-type impurities. The p-type impurity is, for example, aluminum (Al). The impurity concentration of the p-type impurities is, for example, equal to or greater than $1\times10^{16}$ cm$^{-3}$ and equal to or less than $1\times10^{19}$ cm$^{-3}$.

The n$^-$ drift region (second semiconductor region) 14 is provided between the p-type RESURF region 12 and the second surface. The n$^-$ drift region 14 is also provided at the first surface of the element region. The n$^-$ drift region 14 includes n-type impurities. The n-type impurity is, for example, nitrogen (N). The impurity concentration of the n-type impurities is, for example, equal to or greater than $5\times10^{14}$ cm$^{-3}$ and equal to or less than $5\times10^{16}$ cm$^{-3}$.

The n$^+$ cathode region 16 is provided at the second surface of the semiconductor substrate 10. The n$^+$ cathode region 16 includes n-type impurities. The n-type impurity is, for example, nitrogen (N). The impurity concentration of the n-type impurities is, for example, equal to or greater than $1\times10^{18}$ cm$^{-3}$ and equal to or less than $1\times10^{20}$ cm$^{-3}$.

The field oxide film 18 is provided on the p-type RESURF region 12. The field oxide film 18 has an opening which is formed at the element region. The field oxide film 18 is, for example, a silicon oxide film. The thickness of the field oxide film 18 is, for example, equal to or greater than 0.01 µm and equal to or less than 10 µm.

The anode electrode (first electrode) 20 contacts with the n⁻ drift region 14 and the p-type RESURF region 12 in the opening of the field oxide film 18. A contact between the anode electrode 20 and the n⁻ drift region 14 is a Schottky contact. It is preferable that a contact between the anode electrode 20 and the p-type RESURF region 12 be an ohmic contact.

The anode electrode 20 is made of metal. The anode electrode 20 is, for example, a stacked film of titanium (Ti) and aluminum (Al).

The cathode electrode 22 is provided so as to contact with the second surface of the semiconductor substrate 10. The cathode electrode 22 is provided so as to contact with the n⁺ cathode region 16. It is preferable that a contact between the cathode electrode 22 and the n⁺ cathode region 16 be an ohmic contact.

The cathode electrode 22 is made of metal. The cathode electrode 22 is, for example, a stacked film including nickel silicide.

The passivation film 24 is provided on the field oxide film 18 and the anode electrode 20. The passivation film 24 is, for example, a resin film. The passivation film 24 is made of, for example, polyimide.

The p⁺ separation region (third semiconductor region) 30 is provided in the p-type RESURF region 12. The p⁺ separation region (third semiconductor region) 30 is provided at the first surface of the semiconductor substrate 10. The p⁺ separation region 30 includes p-type impurities. The p-type impurity is, for example, aluminum (Al).

The p⁺ separation region 30 is shallower than the p-type RESURF region 12 and has a higher impurity concentration than the p-type RESURF region 12. The impurity concentration of the p⁺ separation region 30 is, for example, equal to or greater than $1 \times 10^{18}$ cm⁻³ and equal to or less than $1 \times 10^{20}$ cm⁻³.

For example, the impurity concentration, width, and depth of the p⁺ separation region 30 are set such that the p⁺ separation region 30 is not completely depleted when a reverse bias is applied between the p-type RESURF region 12 and the n⁻ drift region 14.

As illustrated in FIG. 10, the p⁺ separation region 30 has an annular pattern surrounding the element region.

Next, the function and effect of the SBD 700 according to this embodiment will be described.

When the reverse bias is applied to the pn junction, the electric field is applied to the field oxide film 18 in the termination region in the horizontal direction. Charge in the field oxide film 18 is moved in the horizontal direction by the electric field applied in the horizontal direction. When the charge is moved in the field oxide film 18, the charge balance of the termination region is lost. Therefore, there is a concern that a reduction in reliability, such as a breakdown voltage variation or a leakage current variation, will occur.

In the SBD 700 according to this embodiment, the p⁺ separation region 30 which is shallower than the p-type RESURF region 12 and has a higher impurity concentration than the p-type RESURF region 12 is provided in the p-type RESURF region 12. When the reverse bias is applied to the pn junction between the p-type RESURF region 12 and the n⁻ drift region 14, at least a portion of the p⁺ separation region 30 is not depleted. Therefore, no electric field is generated in a portion of the p⁺ separation region 30 which is not depleted. As a result, the electric field in the horizontal direction is reduced in the field oxide film 18 immediately above the p⁺ separation region 30 and the movement of charge in the field oxide film 18 in the horizontal direction is prevented. It is possible to prevent the charge balance of the termination region from being lost. Therefore, a variation in the characteristics of the SBD 700 is prevented and reliability is improved.

In the SBD 700, the p⁺ separation region 30 has an annular pattern surrounding the element region. Therefore, the movement of charge in the field oxide film 18 in the horizontal direction is effectively prevented.

In this embodiment, three p⁺ separation regions 30 are provided. However, the number of p⁺ separation regions 30 is not necessarily limited to 3. For example, the number of p⁺ separation regions 30 may be 1, 2, or 4 or more.

In this embodiment, the p⁺ separation region 30 has an annular shape. However, the p⁺ separation region 30 is not limited to the annular pattern.

According to this embodiment, it is possible to achieve the SBD 700 which can prevent the movement of charge in the field oxide film 18 in the termination region and improve reliability.

In the above-described embodiments, 4H-SiC is given as an example of the crystal structure of SiC. However, the invention can be applied to devices using SiC with other crystal structures, such as 6H-SiC and 3C-SiC. In addition, the invention can be applied to devices using semiconductors, such as silicon and a GaN-based semiconductor, other than SiC.

In the above-described embodiments, the SBD is mainly given as an example of the semiconductor device. However, the invention can also be applied to other devices, such as a PIN diode, a metal insulator semiconductor field effect transistor (MISFET), and an insulated gate bipolar transistor (IGBT) as long as the devices have the termination region around the element region.

In the above-described embodiments, the first conductivity type is a p type and the second conductivity type is an n type. However, the first conductivity type may be an n type and the second conductivity type may be a p type.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first surface and a second surface, the semiconductor substrate including an element region and a termination region provided around the element region, the termination region having a first semiconductor region of a first conductivity type provided at the first surface and a second semiconductor region of a second conductivity type provided between the first semiconductor region and the second surface;
   a first insulating film provided on the first semiconductor region;
   a second insulating film provided on the first semiconductor region, the second insulating film having a portion interposed between a first part of the first insulating film and a second part of the first insulating film;
   a first electrode provided on the first surface of the element region, the first electrode electrically connected to the first semiconductor region; and
   a second electrode provided at the second surface of the element region and the termination region.

2. The device according to claim 1,
wherein the first insulating film is a silicon oxide film.
3. The device according to claim 1,
wherein the second insulating film is an organic film.
4. The device according to claim 1,
wherein a portion of the second insulating film contacting with the first semiconductor region has an annular shape surrounding the element region.
5. The device according to claim 1,
wherein the portion of the second insulating film interposed between the first part of the first insulating film and the second part of the first insulating film has a width 5 of 1 Pm or more.
6. The device according to claim 1,
wherein the first-conductivity-type impurity concentration of the first semiconductor region at a first position is higher than the first-conductivity-type impurity concentration of the first semiconductor region at a second position further away from the element region than the first position.
7. The device according to claim 1,
wherein the semiconductor substrate is a SiC substrate.
8. The device according to claim 1,
wherein the second semiconductor region is provided at the first surface of the element region, and
the first electrode is electrically connected to the second semiconductor region.
9. The device according to claim 1,
wherein the element region includes a third semiconductor region of the first conductivity type provided at the first surface and the second semiconductor region provided between the third semiconductor region and the second surface, and
the first electrode is electrically connected to the third semiconductor region.
10. The device according to claim 1,
wherein the element region includes:
a third semiconductor region of the first conductivity type provided at the first surface;
the second semiconductor region provided between the third semiconductor region and the second surface;
a fourth semiconductor region of the second conductivity type provided in the third semiconductor region;
a gate insulating film provided on the third semiconductor region; and
a gate electrode provided on the gate insulating film, and
the first electrode is electrically connected to the third semiconductor region and the fourth semiconductor region.

* * * * *